United States Patent
Gajewski et al.

(10) Patent No.: US 12,148,601 B2
(45) Date of Patent: Nov. 19, 2024

(54) METHOD OF PLASMA PROCESSING A SUBSTRATE IN A PLASMA CHAMBER AND PLASMA PROCESSING SYSTEM

(71) Applicant: TRUMPF Huettinger Sp. z o. o., Zielonka (PL)

(72) Inventors: Wojciech Gajewski, Warsaw (PL); Krzysztof Ruda, Zielonka (PL); Jakub Swiatnicki, Zdunska Wola (PL)

(73) Assignee: TRUMPF HUETTINGER SP. Z O. O., Zielonka (PL)

( * ) Notice: Subject to any disclaimer, the term of this patent is extended or adjusted under 35 U.S.C. 154(b) by 294 days.

(21) Appl. No.: 17/697,965

(22) Filed: Mar. 18, 2022

(65) Prior Publication Data

US 2022/0208532 A1 Jun. 30, 2022

Related U.S. Application Data

(63) Continuation of application No. PCT/EP2020/076571, filed on Sep. 23, 2020.

(30) Foreign Application Priority Data

Sep. 23, 2019 (EP) .................................... 19461583

(51) Int. Cl.
*H01J 37/32* (2006.01)
*H01J 37/34* (2006.01)

(52) U.S. Cl.
CPC ........ *H01J 37/32944* (2013.01); *H01J 37/34* (2013.01); *H01J 2237/332* (2013.01)

(58) Field of Classification Search
CPC .......... H01J 37/32036; H01J 37/32935; H01J 37/32944; H01J 37/44; H01J 2237/332
See application file for complete search history.

(56) References Cited

U.S. PATENT DOCUMENTS

| 5,415,757 | A | 5/1995 | Szcyrbowski et al. |
| 5,611,899 | A | 3/1997 | Maass |

(Continued)

FOREIGN PATENT DOCUMENTS

| DE | 4420951 A1 | 12/1995 |
| DE | 102006002333 A1 | 7/2007 |

(Continued)

OTHER PUBLICATIONS

Josh Pankratz et al., "Modeling Crazing or Lightning Arc Defects in Large Area Systems," 61st Annual Technical Conference Proceedings, May 2018, pp. 1-5, 2018 Society of Vacuum Coaters, Albuquerque, New Mexico, U.S.

*Primary Examiner* — Srinivas Sathiraju
(74) *Attorney, Agent, or Firm* — LEYDIG, VOIT & MAYER, LTD.

(57) ABSTRACT

A method of plasma processing a substrate in a plasma chamber is provided. The method includes the steps of supplying a power supply signal to electrodes arranged within the plasma chamber in order to form a plasma in the plasma chamber, monitoring at least one parameter related to the plasma processing, determining a feature related to the at least one monitored parameter, and adjusting the power supply signal during the plasma processing to modify, in particular reduce, the feature. The modification of the feature eliminates or mitigates formation of crazing on the substrate.

21 Claims, 6 Drawing Sheets

(56) References Cited

U.S. PATENT DOCUMENTS

| | | | |
|---|---|---|---|
| 5,698,082 A | 12/1997 | Teschner et al. | |
| 6,332,961 B1 | 12/2001 | Johnson et al. | |
| 6,420,863 B1 | 7/2002 | Milde et al. | |
| 7,262,606 B2 | 8/2007 | Axenbeck et al. | |
| 7,305,311 B2 | 12/2007 | van Zyl | |
| 7,389,203 B2 | 6/2008 | Tanaka | |
| 7,640,120 B2 | 12/2009 | Axenbeck et al. | |
| 8,007,641 B2 | 8/2011 | Winterhalter et al. | |
| 8,082,124 B2 | 12/2011 | Miyano et al. | |
| 8,264,237 B2 | 9/2012 | Coumou | |
| 8,552,665 B2 | 10/2013 | Larson et al. | |
| 9,214,801 B2 | 12/2015 | Bulliard et al. | |
| 9,263,241 B2 * | 2/2016 | Larson | H01J 37/32064 |
| 9,316,675 B2 * | 4/2016 | Klein | G01R 31/00 |
| 9,508,612 B2 * | 11/2016 | Singlevich | H01J 37/32935 |
| 9,685,297 B2 * | 6/2017 | Carter | H01J 37/08 |
| 10,002,749 B2 * | 6/2018 | Grede | H01J 37/32944 |
| 10,181,392 B2 | 1/2019 | Leypold et al. | |
| 10,209,294 B2 | 2/2019 | Bannwarth et al. | |
| 10,217,618 B2 * | 2/2019 | Larson | H01J 37/32064 |
| 10,283,421 B2 * | 5/2019 | Singlevich | H01J 37/32944 |
| 10,290,477 B2 | 5/2019 | Gieraltowski et al. | |
| 11,189,454 B2 * | 11/2021 | Carter | H01J 37/08 |
| 11,804,362 B2 * | 10/2023 | Van Zyl | H01P 7/005 |
| 2006/0032738 A1 | 2/2006 | Wiedemuth et al. | |
| 2006/0100824 A1 | 5/2006 | Moriya | |
| 2008/0218923 A1 | 9/2008 | Wiedemuth | |
| 2009/0308734 A1 | 12/2009 | Krauss | |
| 2012/0285620 A1 * | 11/2012 | Larson | H01J 37/32064 |
| | | | 156/345.28 |
| 2013/0056154 A1 * | 3/2013 | Nakaya | H01J 37/32944 |
| | | | 156/345.24 |
| 2013/0221847 A1 * | 8/2013 | Choi | G01R 19/0061 |
| | | | 315/111.41 |
| 2013/0245969 A1 * | 9/2013 | Singlevich | H01J 37/32917 |
| | | | 702/58 |
| 2014/0062305 A1 * | 3/2014 | Klein | H01J 37/32 |
| | | | 315/111.21 |
| 2014/0062495 A1 * | 3/2014 | Carter | G01N 27/06 |
| | | | 324/459 |
| 2015/0287576 A1 * | 10/2015 | Grede | H01J 37/32064 |
| | | | 315/111.21 |
| 2016/0141155 A1 * | 5/2016 | Larson | H01J 37/32064 |
| | | | 315/111.21 |
| 2016/0217975 A1 | 7/2016 | Leypold et al. | |
| 2017/0077002 A1 * | 3/2017 | Singlevich | H01J 37/32944 |
| 2017/0140905 A1 * | 5/2017 | Mihaylov | H01J 37/32917 |
| 2017/0141000 A1 | 5/2017 | Sakiyama et al. | |
| 2017/0278665 A1 * | 9/2017 | Carter | H01J 37/08 |
| 2018/0040461 A1 | 2/2018 | Pankratz et al. | |
| 2019/0139746 A1 * | 5/2019 | Tsai | H01L 21/67253 |
| 2019/0341235 A1 * | 11/2019 | Pankratz | H01J 37/34 |
| 2021/0050185 A1 * | 2/2021 | Martinez | H01J 37/32165 |
| 2022/0145448 A1 * | 5/2022 | Rappe | H01J 37/34 |
| 2022/0157555 A1 * | 5/2022 | Carter | H01J 37/32944 |
| 2022/0208532 A1 * | 6/2022 | Gajewski | H01J 37/34 |

FOREIGN PATENT DOCUMENTS

| | | |
|---|---|---|
| DE | 102009002684 A1 | 11/2010 |
| DE | 102011007596 B3 | 4/2012 |
| DE | 102013110883 B3 | 1/2015 |
| EP | 3234980 B1 | 2/2019 |
| EP | 2905802 B1 | 5/2019 |
| WO | WO 2004001094 A1 | 12/2003 |
| WO | WO 2004072754 A2 | 8/2004 |
| WO | WO 2008150136 A1 | 12/2008 |

\* cited by examiner

METHOD OF PLASMA PROCESSING A SUBSTRATE IN A PLASMA CHAMBER AND PLASMA PROCESSING SYSTEM

CROSS REFERENCE TO RELATED APPLICATIONS

This application is a continuation of International Application No. PCT/EP2020/076571 (WO 2021/058566 A1), filed on Sep. 23, 2020, and claims benefit to European Patent Application No. EP 19461583.7, filed on Sep. 23, 2019. The aforementioned applications are hereby incorporated by reference herein.

FIELD

Embodiments of the present invention relate to a method and a system for plasma processing a substrate in a plasma chamber.

BACKGROUND

Crazing defects were first identified in large-area sputtering processes driven by AC power supplies. The defects occur on the substrate and lead to damaging the substrate such as architectural glass as described in more detail e.g. in US 2018/0040461 A1. Crazing occurs depending on the power supply used medium frequency (MF) power supply or DC bi-polar power supply, also called bipolar power supply, both a form of AC power supplies. If the occurrence of crazing is detected, different actions can be taken, for example thorough mechanical cleaning of the vacuum chamber components, grounding/insulation of rollers, careful treatment of the glass edges, covering rollers with a synthetic fiber, use of an auxiliary anode biased positively with respect to ground level, or changing the coater geometry. Proper cleanliness of the vacuum chamber is mentioned as one of the possible issues.

The system cleanliness, which is deteriorating during the deposition process, was given as an example for crazing observed during deposition of metal layers such as Ag or Ni—Cr. Grounding/insulation of glass rollers and covering rollers with synthetic fiber is used to keep the glass and all layers of the coating which are already deposited on it, on a floating potential. This has an influence on the behavior of plasma and floating potential dynamics in the system. Few glass manufacturers claim a special treatment to the glass edge to considerably reduce crazing probability.

It has been qualitatively shown that a small rounding of the glass pane edge has a potential to eliminate crazing. This method is, however, limited by the thickness of the glass. Processing of glass with a thickness from 4 to 10 mm showed that as the glass thickness increases the edge rounding becomes less successful in crazing prevention. Other manufacturers have shown that the influence of glass thickness can be eliminated by a controlled change of the target to glass distance.

Effective methods to eliminate or mitigate the occurrence of crazing are needed.

SUMMARY

In an embodiment, the present disclosure provides a method of plasma processing a substrate in a plasma chamber. The method includes the steps of supplying a power supply signal to electrodes arranged within the plasma chamber in order to form a plasma in the plasma chamber, monitoring at least one parameter related to the plasma processing, determining a feature related to the at least one monitored parameter, and adjusting the power supply signal during the plasma processing to modify, in particular reduce, the feature. The modification of the feature eliminates or mitigates formation of crazing on the substrate.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Embodiments of the present invention provide a method and a system that can eliminate or at least decrease the occurrence of crazing.

According to a first aspect of the present invention, a method of plasma processing a substrate in a plasma chamber can include the steps of
a. supplying a power supply signal to electrodes arranged within the plasma chamber in order to form a plasma in the plasma chamber;
b. monitoring at least one parameter related to the plasma processing;
c. determining a feature related to the at least one monitored parameter; and
d. adjusting the power supply signal during the plasma processing to modify, in particular to reduce, the feature,
e. wherein modification of the feature can eliminate and/or mitigate formation of crazing on the substrate.

Whereas conventional methods react to the occurrence of crazing and then perform method steps in order to reduce the crazing, the method according to embodiments of the present invention is applied before crazing even occurs. Therefore, it is possible to eliminate or at least decrease the damage of the substrate due to crazing.

The power supply may be designed to deliver AC power with more than 500 W, in particular more than 5 kW or more than 50 kW.

The power supply may be designed to deliver AC power in a frequency range between 1 kHz and 200 kHz, in particular between 5 kHz and 100 kHz.

The output power of the power supply may be connected to two targets in the plasma chamber, so that both targets may be driven as cathodes and anodes alternately.

The power supply signal that is adjusted may be a current-, a voltage-, or a power-controlled signal. Advantageously it is a current-controlled signal.

The monitored parameter can be for example voltage, current, power, reflected waves (at a basic frequency or other frequency) and/or, or a combination of the aforementioned as, for example, the impedance of the plasma process.

The monitored parameter may be different from the power supply signal that is adjusted. For example: If the power supply signal is a current-controlled signal, the monitored parameter may be a voltage. Or, if the power supply signal is a voltage- or power-controlled signal, the monitored parameter may be a current.

The monitored parameter can be the voltage of one of the targets against the potential of the plasma chamber, which may be ground or earth.

The monitored parameter can additionally be the voltage of the other target against the potential of the plasma chamber, which may be ground or earth.

The monitored parameter can be in particular the voltage between the two targets in the plasma chamber.

The monitored parameter may also be a parameter measured in the plasma chamber or aside the plasma chamber, for example through a window. The monitored or measured parameter may be light, pressure, discharge, electrical, or magnetic field strength or another signal in the plasma chamber.

The monitored parameter can be measured with a sampling rate which is higher than the frequency of the AC power supply, in particular more than ten times higher than the frequency of the AC power supply.

The monitored parameter may be a derivate of a measured value. Then also the velocity or rate of change in a measured value may be the source for the determination of the feature.

The monitored parameter may be a filtered value. Then also a part of the frequency spectrum in a measured value may be the source for the determination of the feature.

The monitored parameter may be a time framed value. That should mean that a predefined time frame is laid over the measured value, and only a time interval of the measured value will be the source for the determination of the feature.

In bipolar plasma processes current controlled power supplies are very often used, that means, that the adjustable power supply signal follows a set value of predefined current. The resulting voltage then depends on the impedance of the plasma, which may be very fast changing. So, the voltage very often does not directly follow the current waveform. It has been found, that not every unproportionality between current and voltage is reason to crazing. But it has also be found that there are typical peculiarities that may lead to crazing.

The 'feature' may be defined by: "feature indicative to crazing". This should mean the 'feature' is something, which is determinable and related to a probability of crazing. Further, the relationship between the crazing and the 'feature' may also be detectable. To detect such a relationship, the following steps may be performed:

A) Determine a probability of crazing with a predefined 'feature' in a first shape.
B) Then the 'feature' may be modified, in particular reduced, compared to the 'feature' with the first shape. This could be done by adjusting the power supply signal (method step d.). The now detectable second shape of the 'feature' is different from the first shape.
C) Determine the probability of crazing with this modified, in particular reduced, 'feature'.
D) If the probability of crazing is lower with the modified, in particular reduced, 'feature', then this is a 'feature indicative to crazing'.

The feature may be one or more or a combination of the following:
  a special value
  a waveform behavior, signal shape, or a pattern
and in these:
  a peculiarity,
  a specialness,
  a distinctive feature,
  a temporary peculiarity,
  an anomaly,
  an unevenness,
  a special unproportionality,
  a deviation or a variation from something expected,
  an unsteadiness,
  an inconsistency
  an incongruity
  an oscillation, vibration, ripple, or ringing,
  an overshoot,
  a post-pulse oscillation,
  a signal dip, or drop,
  reduction with subsequent restoration,
  inconsistency.

In particular, the feature may be a value. The value may reach or exceed a threshold value.

The feature related to the at least one monitored parameter can be a feature derived directly from the monitored parameter, in particular a maximum or minimum of the monitored parameter. Alternatively, the feature can be obtained after processing the monitored parameter. Examples for determining the feature can be found for example in U.S. Pat. No. 8,007,641 B2, DE 10 2011 007 596 B3, U.S. Ser. No. 10/209,294 B2, U.S. Ser. No. 10/181,392 B2, U.S. Pat. No. 7,640,120 B2, U.S. Ser. No. 10/290,477 B2, EP 2905802 B1, EP 3234980 B1, which are hereby incorporated by reference. But the feature can be not only a single event such as a voltage drop in the case of a sudden arc in plasma process. It may be a recurring event. It may be a periodic event, in particular with the period of the power supply, if the power supply signal is a periodic, in particular an AC signal.

The feature may develop over time, for example after one or two or several hours in particular as a result of the contamination or impureness of the plasma chamber or an unwanted deposition of parts or tools in the plasma chamber.

It is not always easy to understand which features or parts of a monitored parameter may be relevant to reduce the probability of crazing. Some features look obvious, some are easy to detect, others are hard to detect. Especially when a combination of more than one feature may be relevant for crazing, it can be very difficult to find these. Advantageously, a method and/or system with machine learning algorithm and/or artificial intelligence algorithms may be used to identify a parameter as a relevant parameter related to an increased probability of crazing and/or a feature as a relevant feature related to an increased probability of crazing. For the method and/or system with machine learning algorithm and/or artificial intelligence algorithms the event of crazing in the substrate should additionally be monitored and analysed. With that monitoring and analysis, a set of training data and test data may be recorded. In such a way the method and the system may be trained and, in particular, checked and, in particular, continuously improved.

The monitored parameter may be, but should not be limited to, an electric potential between:
a. the electrodes arranged within the plasma chamber, or
b. one of the electrodes arranged within the plasma chamber and a reference electrode, or c. both electrodes arranged within the plasma chamber and a reference electrode,
where the reference electrode may be grounded or floating.

It should be noted that the method, in particular the method steps, may be performed without interrupting the plasma processing. In particular the method step d. where the power supply signal during the plasma processing is adjusted to modify, in particular to reduce, the feature may be performed without interrupting the plasma processing.

According to a method variant at least one of an electrode-to-electrode potential and an electrode-to-ground potential are monitored. In particular, if two electrodes are provided in the plasma chamber and each electrode is a target, the target-to-target potential can be monitored. Furthermore, the target-to-ground potential can be monitored, if at least one electrode being a target is provided in the plasma chamber.

Determining the feature may comprise comparing the at least one monitored parameter or a quantity derived therefrom with a threshold border. A threshold border may be one, or more, or a combination of the following:
   a value, such as a value of voltage, current, power, frequency, impedance or the like,
   a pattern, a waveform, or a signal shape of voltage, current, power, frequency, impedance or the like.

The threshold border may be derived by one, or more, or a combination of the following:
   a measurement with a reference load, such as a resistor, capacitor, inductivity, a "non-crazing-plasma", or the like, or a combination of these load components,
   derivation of such a measurement
   a simulation,
   statistical analysis,
   machine learning and/or artificial intelligence The feature that is determined may be a maximum or minimum of the monitored parameter. In particular, the feature may be a maximum of a target-to-target potential or of an electrode-to-ground potential.

Alternatively or additionally, determining the feature may comprise counting the number of times the at least one parameter or a quantity derived therefrom exceeds a threshold border in a given time interval. Hence, determining the feature corresponds to determining the number of times a predetermined event occurs in a given time interval. Determining such a feature has the effect that the monitored parameter is observed over a longer period of time and that the power supply signal is not adjusted too fast or too drastically.

Adjusting the power supply signal may comprise applying several sets of parameters to produce the power supply signal, determining the effect of a particular set of parameters on the feature, and selecting the parameter set leading to a more preferable level of the feature, in particular to reach its minimum or maximum level for further plasma processing. The more preferable level of the feature may be the level where the probability of crazing may be significantly reduced. The parameter sets that are applied to produce the power supply signal may be given. Also, test runs may be performed to determine parameter sets that lead to a change in the feature. Also, it is possible to obtain parameter sets from other plasma processes from other plasma supply systems that have led to a reduction of the feature.

Furthermore, adjusting the power supply signal may comprise at least one of
a. modifying the amplitude of at least one power supply signal component, in particular of current and/or voltage,
b. modifying the waveform of at least one power supply signal component, in particular of current and/or voltage,
c. modifying the frequency of at least one power supply signal component, in particular of current and/or voltage.

If one of the parameters is changed, one or more of the other parameters may have to be changed as well in order to keep the power constant. For example, if the duty cycle is changed, i.e. the waveform of the power supply signal component is changed, the amplitude of the power supply signal component may have to be changed as well. The amplitude, waveform and frequency of a power supply signal component may be the parameter set or part of the parameter set applied for producing the power supply signal.

At least some of the method steps may be performed in response to a user demand. For example, in the case of an older power supply, where monitoring and/or detecting can only be done using external equipment to determine the feature, the method can be triggered by a user.

Alternatively, at least some of the method steps may be performed in response to detecting that at least one monitored parameter exceeds a threshold border. Hence the improvement of the plasma processing process can be initiated if a monitored parameter exceeds a threshold border. The threshold border can be given, or user defined or determined by algorithm, such as a machine learning algorithm and/or artificial intelligence algorithms.

For the method and system with machine learning algorithm and/or artificial intelligence algorithms the event of crazing in the substrate should additionally be monitored. With that monitoring and analysis, a set of training data and test data may be recorded. In such a way the method and the system may be trained and, in particular, checked and, in particular, continuously improved.

Alternatively, at least some of the method steps may be performed in response to statistical data obtained from a range of power supplies supplying power to a plasma process. In particular, the inventive method can be activated as a background application and use statistical data from a range of power supplies available in a central processing system, in particular a cloud computing system, to perform sophisticated improvement and return settings to the power supply to regulate the operating parameters, such as voltage and/or current waveform, amplitude and frequency. Statistical data may be obtained from different power supplies, in particular data collected in the cloud from power supplies from different places and different plasma processes. A neural network may be used to decide which parameters and/or features may be better qualified than other ones and the ones which are better qualified may get a higher relevance in the respective method steps.

According to a further aspect, embodiments of the present invention relate to a plasma processing system, comprising:
a. a plasma chamber,
b. at least one electrode located inside the plasma chamber,
c. at least one power supply supplying a power supply signal to the plasma chamber,
d. at least one sensor for measuring at least one plasma process parameter, such as an electric potential,
e. at least one determination unit configured to determine a feature related to the at least one monitored parameter,
f. a control unit for controlling the power supply in response to the feature, wherein the control unit is configured to adjust the power supply signal such that the feature is modified, in particular reduced.

The at least one electrode may be a target. The sensor for measuring at least one plasma process parameter may be a voltage sensor, a current sensor, a directional coupler or the like.

The determination unit to determine the feature may be a computational unit or a processor or a software application implemented in a computational unit.

In particular, the determination unit may comprise a comparator comparing the at least one monitored parameter or a quantity derived therefrom to a threshold border. For example, a voltage or current may be compared to a threshold border.

The determination unit may also comprise a counter, counting the number of times the monitored parameter or quantity derived therefrom exceeds the threshold border. For example, the determination unit, in particular the counter, may count, how often per unit time the target-to-target voltage rises above the threshold feature.

The power supply may be an MF power supply. An MF power supply may be designed to deliver an output power where the output voltage and/or output current are formed sinusoidal.

The power supply may also be a bipolar supply. A bipolar power supply may designed to deliver an output power where the output voltage and/or output current are formed rectangular or stepwise rectangular or in a predefined way as described in DE 10 2009 002 684 A1 or DE 10 2014 220 094 A1 which are hereby incorporated by reference. A bipolar supply has the advantage that the duty cycle, voltage and frequency can be adjusted without changing the power. In particular, the power can be kept constant. Thus, the power delivered to the plasma process can be kept constant, but the parameters for creating the power can be adjusted. This can lead to the prevention of crazing.

The power supply may be designed to balance the power between both outputs as described for example in EP 1 593 143 B1 which is hereby incorporated by reference.

Furthermore, the bipolar power supply may be configured to supply power to two targets simultaneously. In particular, the bipolar power supply may be configured to supply a dual magnetron sputtering arrangement with power.

The control unit may be integrated in the power supply or the control unit may be external to the power supply. If the control unit is external to the power supply, it can be used for several power supplies.

The sensor may be positioned at the power supply output or in the vicinity of the electrode, in particular in the vicinity of the target. The monitored parameter can be measured directly at the power supply output and/or on the target. In particular, the measurement can be taken at the closest point accessible for such measurements, for example at the cable connection to the target end-blocks.

Compared to previous solutions, the control unit according to the embodiments of the present invention, which is configured to perform the inventive method, can actively minimize the root cause of crazing by minimizing the feature, in particular by minimizing the target-to-target potential and/or the target-to-ground potential. The method can be used as continuously adapting method. The control unit can thus continuously react to condition changes in the system, for example, due to progressive growth of a parasitic coating on system elements or cyclic modification of the working conditions of the power supply itself.

The control unit may comprise a user interface for triggering an adjustment of the power supply signal. In particular, a user can trigger the method by using the user interface.

The plasma processing system may comprise several power supplies that exchange data with a cloud computing system. Hence, suitable parameters obtained for one power supply can be used for other power supplies, supplying power to similar plasma processes.

Figure 1:
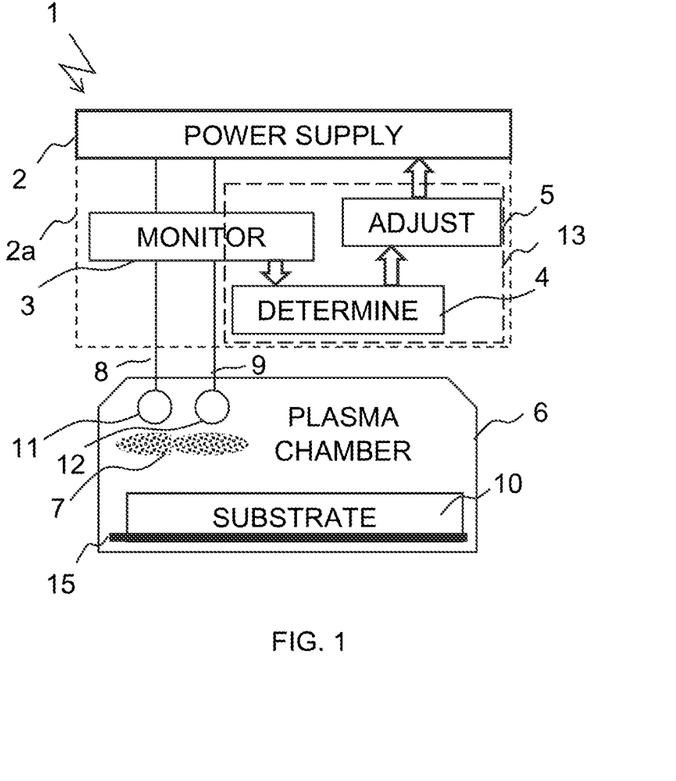
FIG. 1 shows a plasma processing system according to some embodiments.

FIG. 1 shows a plasma processing system 1. This may be an in-line coater. The plasma processing system 1 comprises a plasma chamber 6 for processing substrates 10, which are disposed on a substrate carrier 15. The plasma processing system 1 comprises a power supply 2 connected to electrodes 11, 12 via power lines 8, 9. The electrodes 11, 12 are arranged within the plasma chamber 6. By supplying power to the electrodes 11, 12 a plasma 7 may be formed and maintained in the plasma chamber 6. The electrodes 11, 12 may be rotating electrodes. the plasma may be enhanced by magnets; so that the plasma process may be a magnetron plasma process. The plasma process may be for sputtering material from electrodes 11, 12. Such electrodes 11, 12 in a plasma processing system 1 are also called target. The plasma processing system 1 may be designed for deposition of material on the substrate 10. It may be a PVD, CVD reactive plasma process or the like. The power supply 2 may be an AC power supply, delivering an AC Signal to both electrodes 11,12. Then both electrodes 11, 12 may work as cathodes and anodes alternatively.

Crazing arc defects may occur on the surface of insulating materials during sputtering deposition and may damage the product, generating significant waste and financial losses in production. Especially in the case of Large Area Coating (LAC) for architectural glass manufacturing each occurrence of crazing hinders continuity of production, and in extreme cases forces the production cycle to stop before scheduled system maintenance.

In the case of sputtering deposition of functional coatings on glass, crazing has been reported to occur at different stages of the multilayer structure deposition. As more and more glass coaters shift from an MF-driven dual magnetron sputtering to Bipolar power supplies the versatility of frequency and current/voltage output waveform modifications available in Bipolar power supplies unintentionally led to increased probability of crazing occurrence for some parameters combinations. In the event of excessive crazing typically a thorough mechanical cleaning of vacuum chamber components is undertaken to eliminate the loss of glass product.

It has been found that the occurrence of crazing may be attributable to accumulation of charge on the surface of coated glass. The glass which undergoes the deposition is moved under the plurality of magnetron arrangements (typically dual target magnetrons) by rollers made of insulation material. Glass itself is also a dielectric material very often even with the deposited coatings and since it has no electrical contact with the chamber walls, one may assume it is on a floating potential. An in-depth analysis of collected data allowed to identify a relationship between the occurrence of crazing and the electrical potential of an anode. Since the dynamics of plasma species depend on the driving force for the plasma discharge generation (the voltage and current waveform), a series of measurements of the anode voltage as a function of the bipolar power supply setting configuration such as current waveform have been performed. It could be found that in changing the waveform of current, voltage and/or power the crazing effect could be influenced in a positive way. One very successful parameter setting for systems under investigation are presented schematically in FIG. 3 as it will be explained in more detail later. For this particular case operation with a trapeze mode and 1% brake time between the pulses resulted in the lowest anode voltage level measured at a pulsing frequency around 10 kHz. In contrary, operation in a default full mode (rectangular voltage and output waveform) at 10 kHz resulted in more than two times higher anode voltage. Tests performed on a coater line confirmed a significant reduction or even elimination of crazing effect when attaining the power supply operation point of reduced anode voltage.

In a normal production cycle of coated glass, the crazing effect is not the only parameter influencing the quality of the product and the efficiency of the production process. If the coating layer stack configuration includes sputtering from heavily arcing targets in reactive atmosphere indicators such as arc suppression efficiency or target condition need to be taken into account. For these reasons, the improvement of the bipolar power supply settings for anode voltage minimization could include keeping the operation within the recommended parameter range. For example, if silicon targets are used for reactive sputtering of a $SiO_2$ layer the frequency can be varied in a range allowing operation without a risk of nodules formation. Nodules, an arc-related local damage, of target surface, may arise if arc suppression mechanisms are misused or the operation frequency is lower than a threshold value.

The plasma processing system 1 in FIG. 1 comprises also a monitor unit 3, which is configured to monitor a parameter such as voltage, current and/or power, or the like. It may comprise a voltage sensor, a current sensor and/or a power sensor. The monitor unit 3 may also comprise an ADC, in particular with a high sampling rate as mentioned above.

The plasma processing system 1 comprises also a determination unit 4, which is configured to determine a feature related to the at least one monitored parameter. This may comprise a comparator or software to compare the monitored parameter with a threshold border. In this way, the feature may be determined. The determination unit 4 may comprise a computer, a data memory and program memory, configured to operate software with algorithms to determine the feature. The variants of algorithms have been disclosed in detail above.

The plasma processing system 1 comprises also an adjusting unit 5, configured to adjust the power supply signal at the output of the power supply 2. As mentioned above, the power supply unit 1 may be a bipolar power supply unit, where several adjusting parameters are available, such as current, voltage, power, duty cycle, pulse-off time and shape of waveforms, such as rectangular, step-wise rectangular, trapeze- or sinus-shape or the like.

Figure 2:
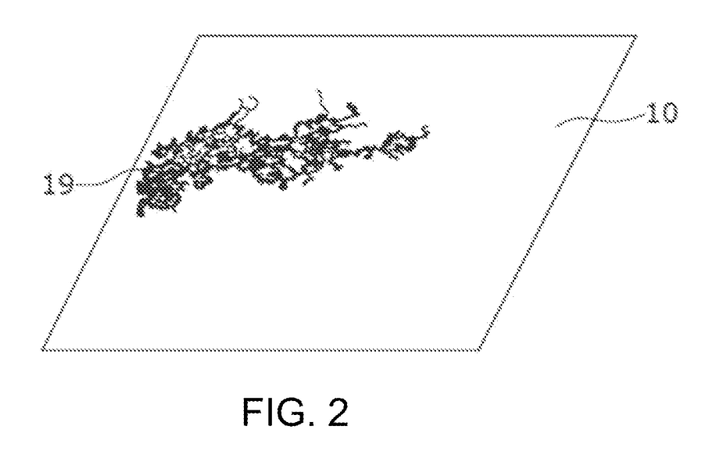
FIG. 2 shows a typical crazing defect on a substrate.

The monitor unit 3, the determination unit 4, and the adjusting unit 5 may be all together or each part of the power supply 2a. As an example, a power supply 2a is drafted in dotted lines in FIG. 1 where all three units 3,4,5 are part of the power supply 2a. A control unit 13 comprises the adjusting unit 5. Additionally, the control unit 13 may comprise the determination unit 4. Additionally, the control unit 13 may comprise the monitor unit 3 at least partly FIG. 2 shows a typical crazing damage 19 on a glass substrate 10.

Figure 3:
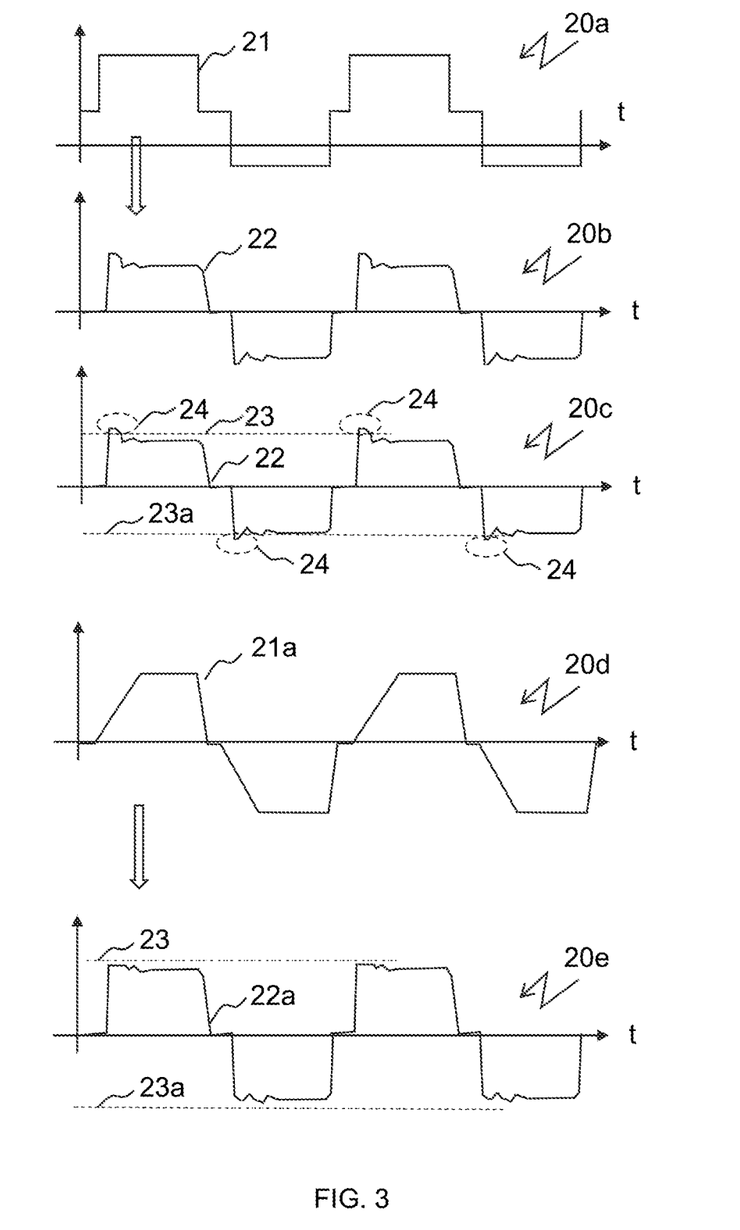
FIG. 3 shows graphs of signals over time according to some embodiments.

FIG. 3 shows five graphs over time t to explain the method steps.

Graph 20a shows a power supply signal 21 which is led to the electrodes 11, 12 to maintain plasma 7. This could be a current, voltage, or power signal. Advantageously this is a current signal. It is a typical AC signal as it is delivered by a bipolar power supply.

Graph 20b shows a monitored parameter 22 related to the plasma processing. This could be a current, voltage, or power signal. Advantageously, this is a voltage signal, measured between electrode 11 or 12 and ground.

Graph 20c shows again the monitored parameter 22. Additionally, two threshold values 23, 23a are shown as dotted lines. It can be seen that the monitored parameter 22 exceeds the threshold values 23, 23a periodically. Here the determination unit 4 determines a feature 24 related to the at least one monitored parameter 22.

Graph 20d shows an adjusted power supply signal 21a, which has now trapeze-shape. Other shapes are also possible, but this shape is one example which seems in this or a similar way to be successful in improving the plasma supply system with reduced crazing.

Graph 20e shows again a monitored parameter 22a. But this time it has changed as a result of the changed power supply signal 21a and the reaction of the plasma 7 inside the plasma chamber 6. It can be seen that the feature 24 from graph 20c has been modified. Here the modification of the feature may be considered as a decrease of the original value, so it can be seen that the feature 24 from graph 20c has been reduced, and the monitored parameter 22a does not exceed the threshold 23 anymore.

Figure 4:
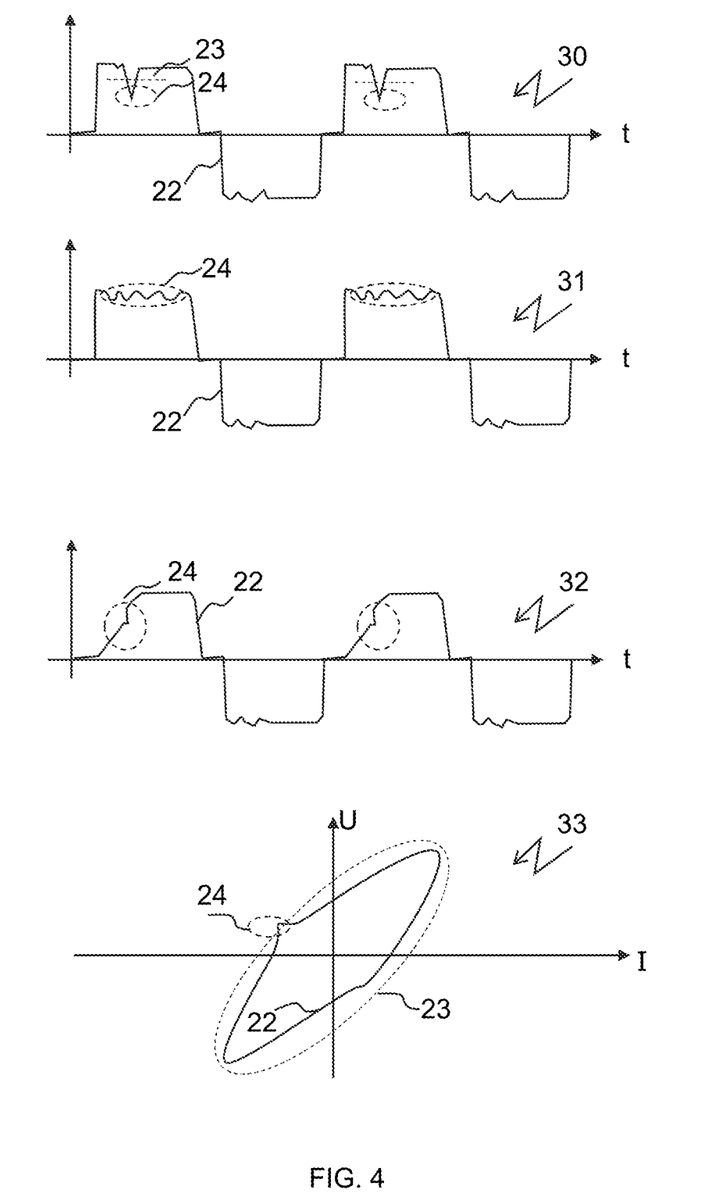
FIG. 4 shows some forms of features according to some embodiments.

FIG. 4 shows in four graphs 31-34 some typical forms of peculiarities.

Graph 30 shows a periodic parameter drop as a feature 24. Such a feature may be determined by a threshold border 23, but the monitored parameter needs to be a time framed part of the measured value.

Graph 31 shows a ringing, oscillation, or ripple as a feature 24. For determining such a feature, a filter may be used.

Graph 32 shows a stepwise rising with a sharp kink as a feature 24. For determining such a feature, a derivative of the measured value may be used as monitored parameter in order to determine the feature.

Graph 33 shows a different view on measured values. Here the voltage over current is monitored in a graph. The expected form may be an ellipse which is driven a loop every period. So, the threshold border 23 may be such an ellipse. With that a feature 24 may be detected as well.

Figure 5:
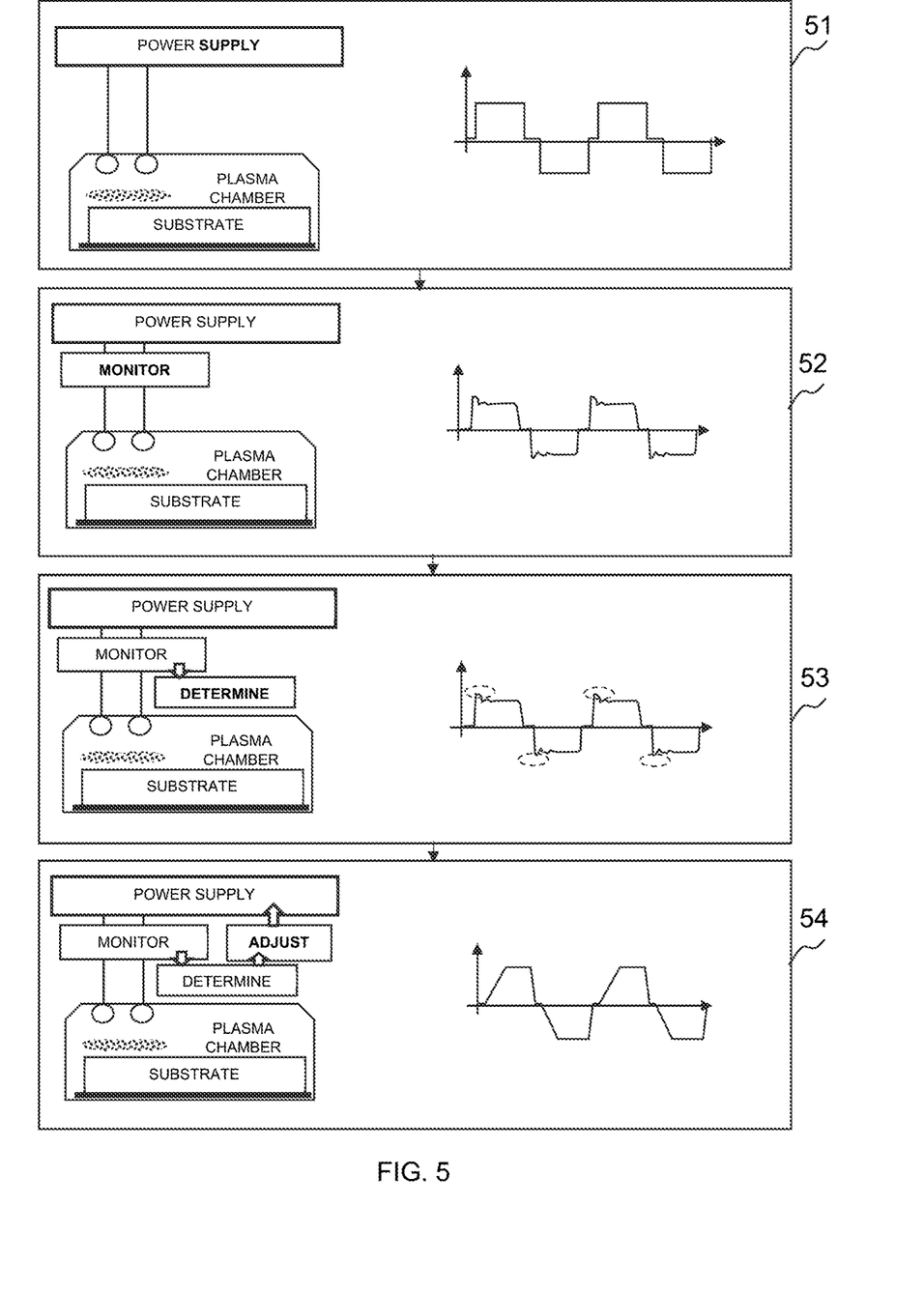
FIG. 5 shows a flowchart illustrating a method according to some embodiments.

FIG. 5 shows a flow chart of the method of plasma processing a substrate 2 in a plasma chamber 6. In step 51 a power supply signal is supplied to the plasma chamber 6 in order to form a plasma 7 in the plasma chamber 6.

In step 52 at least one parameter related to the plasma processing is monitored.

In step 53 a feature 24 related to the at least one monitored parameter 22 is determined.

In step 54 the power supply signal is adjusted during the plasma processing to modify, in particular reduce, the feature.

Figure 6:
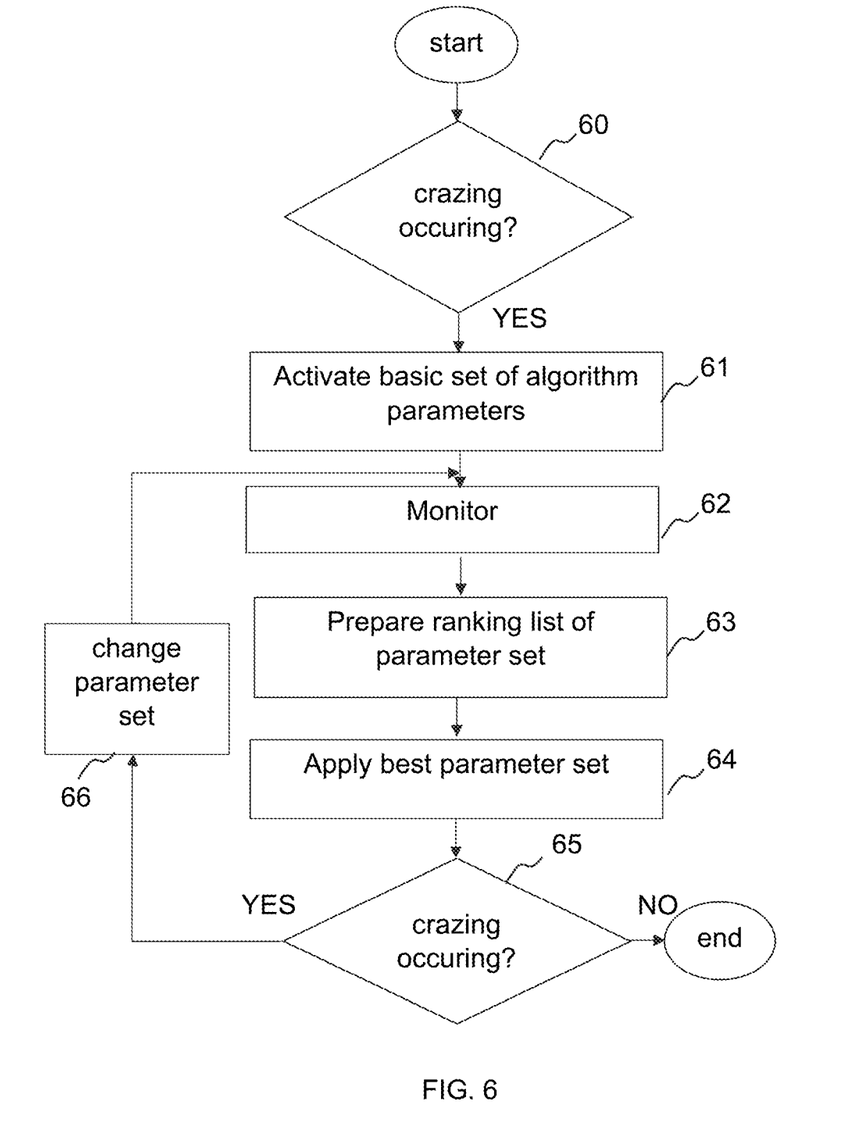
FIG. 6 shows another flowchart illustrating a method according to some embodiments.

FIG. 6 shows an additional flowchart of the inventive method. In this case it is checked at step 60 if a crazing can be detected. If a crazing is detected, the method according to claim 1 or to FIG. 5 is performed with a basic set of algorithm parameters being used. In step 63 the parameters are monitored as described in the method according to claim 1 or according to FIG. 5. Step 62 is repeated for a certain number of different sets of parameters. At step 63 a ranking list of parameter sets is created. In particular, a parameter set which leads to the lowest feature is selected. At step 64 the best ranked parameter set is used for adjusting the power supply signal. In step 65 again it is checked if a crazing can be detected. If yes, the parameter set is changed in step 66, and again it is monitored in step 62 and the process follows then from step 62 to 63 and so on. If not, the method may end.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A method of plasma processing a substrate in a plasma chamber, the method comprising:
   supplying a power supply signal to electrodes arranged within the plasma chamber in order to form a plasma in the plasma chamber;
   monitoring at least one parameter related to the plasma processing;
   determining a feature related to the at least one monitored parameter; and
   adjusting the power supply signal during the plasma processing to modify the feature,
   wherein the modification of the feature eliminates or mitigates formation of crazing on the substrate.

2. The method according to claim 1, wherein the feature is a recurring event.

3. The method according to claim 2, wherein the feature is a periodic event.

4. The method according to claim 3, wherein the power supply signal is an AC signal, and the periodic event relates to a period of the power supply signal.

5. The method according to claim 1, wherein the monitored parameter is different from the power supply signal that is adjusted.

6. The method according to claim 1, wherein a machine learning algorithm is used to identify the at least one parameter as a relevant parameter related to an increased probability of crazing.

7. The method according to claim 1, wherein the monitored parameter comprises an electric potential between one of:
   the electrodes arranged within the plasma chamber, or
   one of the electrodes arranged within the plasma chamber and a reference electrode, or
   both electrodes arranged within the plasma chamber and a reference electrode, wherein the reference electrode is grounded or floating.

8. The method according to claim 1, wherein the modification of the feature is performed without interrupting the plasma processing.

9. The method according to claim 1, wherein determining the feature comprises comparing the at least one monitored parameter or a quantity derived from the at least one monitored parameter to a threshold border.

10. The method according to claim 1, wherein determining the feature comprises counting a number of times the at least one parameter or a quantity derived the at least one parameter exceeds a threshold border in a given time interval.

11. The method according to claim 1, wherein adjusting the power supply signal comprises applying several sets of parameters to produce the power supply signal, determining an effect of each respective set of parameters of the several sets of parameters on the feature, and selecting the respective set of parameters leading to a minimum level or a maximum level for further plasma processing.

12. The method according to claim 1, wherein adjusting the power supply signal comprises at least one of:
   modifying an amplitude of current and/or voltage,
   modifying a waveform of current and/or voltage, or
   modifying a frequency of current and/or voltage.

13. The method according to claim 1, wherein at least some of the method steps are performed in response to a user demand.

14. The method according to claim 1, wherein at least some of the method steps are performed in response to detecting that the at least one monitored parameter exceeds a threshold border.

15. The method according to claim 1, wherein at least some of the method steps are performed in response to statistical data obtained from a range of power supplies supplying power to the plasma process.

16. A plasma processing system comprising:
   a plasma chamber,
   at least one electrode located inside the plasma chamber,
   at least one power supply configured to supply a power supply signal to the at least one electrode in order to form a plasma in the plasma chamber,
   at least one sensor for measuring at least one plasma process parameter related to a plasma processing of a substrate inside the plasma chamber,
   at least one determination unit configured to determine a feature related to the at least one plasma process parameter of the plasma processing, and
   a control unit for controlling the power supply in response to the feature, wherein the control unit is configured to adjust the power supply signal during the plasma processing such that the feature is modified so as to eliminate or mitigate formation of crazing on the substrate.

17. The plasma processing system according to claim 16, wherein the determination unit comprises a comparator configured to compare the at least one monitored parameter or a quantity derived from the at least one monitored parameter to a threshold border.

18. The plasma processing system according to claim 16, wherein the determination unit comprises a counter configured to count a number of times the at least one monitored parameter or quantity derived the at least one monitored parameter exceeds a threshold border.

19. The plasma processing system according to claim 16, wherein the power supply is a bipolar power supply.

20. The plasma processing system according to claim 16, wherein the control unit is integrated in the power supply or is external to the power supply.

21. The plasma processing system according to claim 16 comprising several power supplies that exchange data with a cloud computing system.

\* \* \* \* \*